United States Patent [19]
Fischer et al.

[11] Patent Number: 5,949,361
[45] Date of Patent: Sep. 7, 1999

[54] MULTI-STAGE DELTA SIGMA MODULATOR WITH ONE OR MORE HIGH ORDER SECTIONS

[75] Inventors: Godi Fischer, Narragansett, R.I.; Alan J. Davis, Fairhaven, Mass.

[73] Assignee: The United States of America represented by the Secretary of the Navy, Washington, D.C.

[21] Appl. No.: 08/854,511

[22] Filed: May 12, 1997

[51] Int. Cl.[6] .................................................. H03M 3/02
[52] U.S. Cl. ........................................... 341/143; 341/126
[58] Field of Search ..................................... 341/126, 143

[56] References Cited

U.S. PATENT DOCUMENTS

| | | | |
|---|---|---|---|
| 5,061,928 | 10/1991 | Karema et al. | 341/143 |
| 5,442,354 | 8/1995 | Cabler | 341/143 |
| 5,648,779 | 7/1997 | Cabler | 341/143 |
| 5,760,722 | 6/1998 | Harris et al. | 341/143 |

*Primary Examiner*—Marc S. Hoff
*Attorney, Agent, or Firm*—Michael J. McGowan; Prithvi C. Lall; Robert W. Gauthier

[57] ABSTRACT

A wide-band sigma-delta modulator is disclosed having a cascade of two modulators or stages, the first stage being of third or greater order and the second being of second or greater order. Both stages utilize simple ternary quantizers to avoid linearity problems associated with the digital to analog converters in the feedback paths of the modulators and to maintain stable operation. Additional zeros are placed in the noise transfer functions of third or higher order stages by means of additional feedback loops between the output of the third integrator and the second summing junction to maximize the dynamic range. The new topology significantly enhances the dynamic range of the system while hardly affecting the circuit's sensitivity with regard to some non-idealities such as finite amplifier open-loop gains or capacitor ratio mismatches. The excess dynamic range gained by these additional zeros is substantial and independent of OSR, hence, the present invention is particularly useful in wide-band applications where the OSR is inherently low. By employing only two cascaded stages, amplifier gain and capacitor ratio matching requirements are kept reasonably low.

20 Claims, 2 Drawing Sheets

MULTI-STAGE DELTA SIGMA MODULATOR WITH ONE OR MORE HIGH ORDER SECTIONS

STATEMENT OF GOVERNMENT INTEREST

The invention described herein may be manufactured and used by or for the Government of the United States of America for governmental purposes without the payment of any royalties thereon or therefore.

BACKGROUND OF THE INVENTION (1) Field of the Invention

The present invention relates generally to an apparatus for converting analog-to-digital or digital-to-analog signals, and more particularly to a robust sigma-delta modulator for implementing a high-precision analog-to-digital or digital-to-analog converter.

(2) Description of the Prior Art

Sigma-delta modulators have become a popular means to implement high-precision analog-to-digital converters (ADC's) or digital-to-analog converters (DAC's) in that the technique enables the realization of high-resolution data converters while requiring only low to moderate precision analog components. FIG. 1 shows a detailed block diagram of a conventional sigma-delta modulator 10. Modulator 10 consists of a summing junction 12, a filter circuit 14, a quantizer 16 and a DAC 18 within a feedback circuit. Sampling switch 20 provides analog input $X(z)$ to summing junction 12 at the frequency of sampling clock 22. The output 24 of summing junction 12 is provided to filter circuit 14 with the output 26 of filter circuit 14 provided to quantizer 16. Quantizer 16 is also controlled by sampling clock 22 to convert the analog signal produced by filter circuit 14 to an output pulse density modulated (PDM) digital signal $Y(z)$. The output $Y(z)$ is also fed back to DAC 18, which reconverts the digital signal to an analog signal 28. Signal 28 is then applied to the negative input of summing junction 12, such that, unless the output $Y(z)$ is exactly the same as input $X(z)$, an error signal will be developed by summing junction 12 which will then pass through the loop to correct the output. This feedback loop filters the difference between the previous output and the current input sample. By means of algebraic decomposition and linearity assumptions of quantizer 16, input signal $X(z)$ is passed through a low pass filter that is wider than the desired band, while the quantization error, i.e., the difference between the value input to quantizer 16 and the value output from quantizer 16, is filtered by a high pass filter with good stop band suppression. Hence the signal is passed unsuppressed while the quantization noise is attenuated in the band of interest. Consequently, these devices have a relatively low conversion rate when compared to other ADC's and DAC's due to the necessary high OSR. Apart from limiting the frequency range, high OSR's negatively impact power dissipation and the settling requirements for the amplifiers employed in the discrete-time analog integrators. It is therefor of great practical interest to find alternative modulator topologies that can cope with low OSR's while preserving the inherent insensitivity of the converter with regard to its constituent analog components.

Three basic ways of reducing the OSR are known in the art. The first method is to replace the typical single-bit quantizer at the modulator output by a multi-bit quantizer as described by Larson, L. E., Cataltepe, T. and Temes, G. C. in "Multi-bit Oversampled Sigma-Delta A/D Converters With Digital Correction", *IEE Electronics Letters*, vol. 24, pp. 1051–1052, August 1989. This method not only reduces the quantization noise thus increasing the dynamic range of the converter, but also de-correlates the quantization noise spectrum from the input signal. Such a system is less likely to fall into a cyclic behavior which can give rise to spurious tones in the passband. However, the major drawback of this method is the extremely high linearity requirement for the DAC in the feedback path of the modulator multi-loop configuration. It is noted that the required accuracy of this DAC must be greater than or equal to the quantization noise suppression in the modulator pass band. For example, if the modulator accuracy needs to be 16 bits, then the integral linearity of the DAC must be no worse than 96 dB or 0.00158%, since DAC errors are added unfiltered to the input signal, as shown in FIG. 1. Integral linearity errors in the DAC will produce unwanted tones, i.e., harmonic distortion, which will limit the system accuracy to that of the total harmonic distortion. Unfortunately, the DAC integral linearity is directly dependent upon the relative error in the ratios of values derived from monolithic passive components. Thus, since this ratio of values is 0.01% at best, the integral linearity error can be kept to no better than 0.01%. making it difficult to obtain greater than 60 dB, or 10 bit accuracy due to the harmonic distortion.

In a second approach, the single modulator loop is replaced by a multi-loop configuration whereby the additional loop(s) create an estimate of the quantization noise of the previous loop(s). The noise estimate is digitally subtracted from the previous loop output(s). The multi-loop solution whitens the quantization noise and thus prevents the occurrence of spurious tones. In theory, one can achieve arbitrarily good noise shaping by cascading a sufficient number of stages. However, the reduction of the quantization noise by signal subtraction requires well matched capacitor ratios in the analog modulator loops and extremely high op-amp open-loop gain values to minimize integrator leakage. These requirements practically limit the number of cascaded stages to two or three. Even with two or three stages, 15 to 16 bit accuracy is difficult to achieve.

In the third approach, the order of the loop filter is increased such that a more stable noise shaping filter is possible. The multiple feedbacks of a higher order system tend to de-correlate the quantization noise from the input signal. In contrast to the multi-bit solutions, high-order single-bit modulators preserve the insensitivity of single-bit low-order circuits with respect to minor variations of the analog component values. The major drawback of this approach is that there is a progressive reduction in quantization noise suppression gains as the OSR is lowered in order to maintain a stable operating point.

SUMMARY OF THE INVENTION

Accordingly, it is an object of the present invention to provide a sigma-delta modulator topology that can cope with low OSR's while preserving the inherent insensitivity of the converter with regard to its constituent analog components.

Another object of the present invention is to provide a sigma-delta modulator topology that does not require an extremely high linearity for the DAC in the feedback path of the modulator multi-loop configuration.

Still another object of the present invention is to provide a sigma-delta modulator topology where the amplifier gain and capacitor ratio matching requirements are kept reasonably low.

Other objects and advantages of the present invention will become more obvious hereinafter in the specification and drawings.

In accordance with the present invention, a wide-band sigma-delta modulator is provided with a cascade of two modulators or stages, the first stage being of third or greater order and the second being of second or greater order. Both stages utilize simple ternary quantizers to avoid linearity problems associated with the DAC's in the feedback paths of the modulators and to maintain stable operation. Reducing the quantization noise at its source enables a more efficient noise shaping characteristic by allowing the poles of the modulator loop filter to be placed closer to the Nyquist frequency. Additional zeros are placed in the noise transfer functions of third or higher order stages to maximize the dynamic range. The new topology significantly enhances the dynamic range of the system while hardly affecting the circuit's sensitivity with regard to some non-idealities such as finite amplifier open-loop gains and capacitor ratio mismatches. The excess dynamic range gained by these additional zeros is substantial and independent of OSR, hence, the present invention is particularly useful in wide-band applications where the OSR is inherently low. By employing only two cascaded stages, the amplifier gain and capacitor ratio matching requirements are kept reasonably low.

BRIEF DESCRIPTION OF THE DRAWINGS

A more complete understanding of the invention and many of the attendant advantages thereto will be readily appreciated as the same becomes better understood by reference to the following detailed description when considered in conjunction with the accompanying drawings wherein corresponding reference characters indicate corresponding parts throughout the several views of the drawings and wherein.

DESCRIPTION OF THE PREFERRED EMBODIMENT

Figure 1:
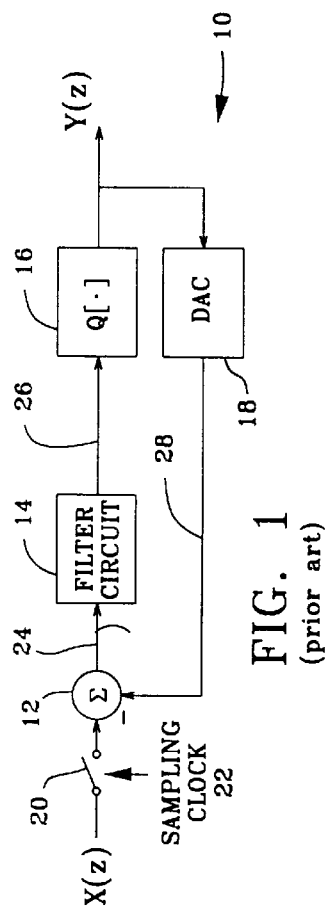
FIG. 1 is a detailed block diagram of a prior art sigma-delta modulator.
Figure 2:
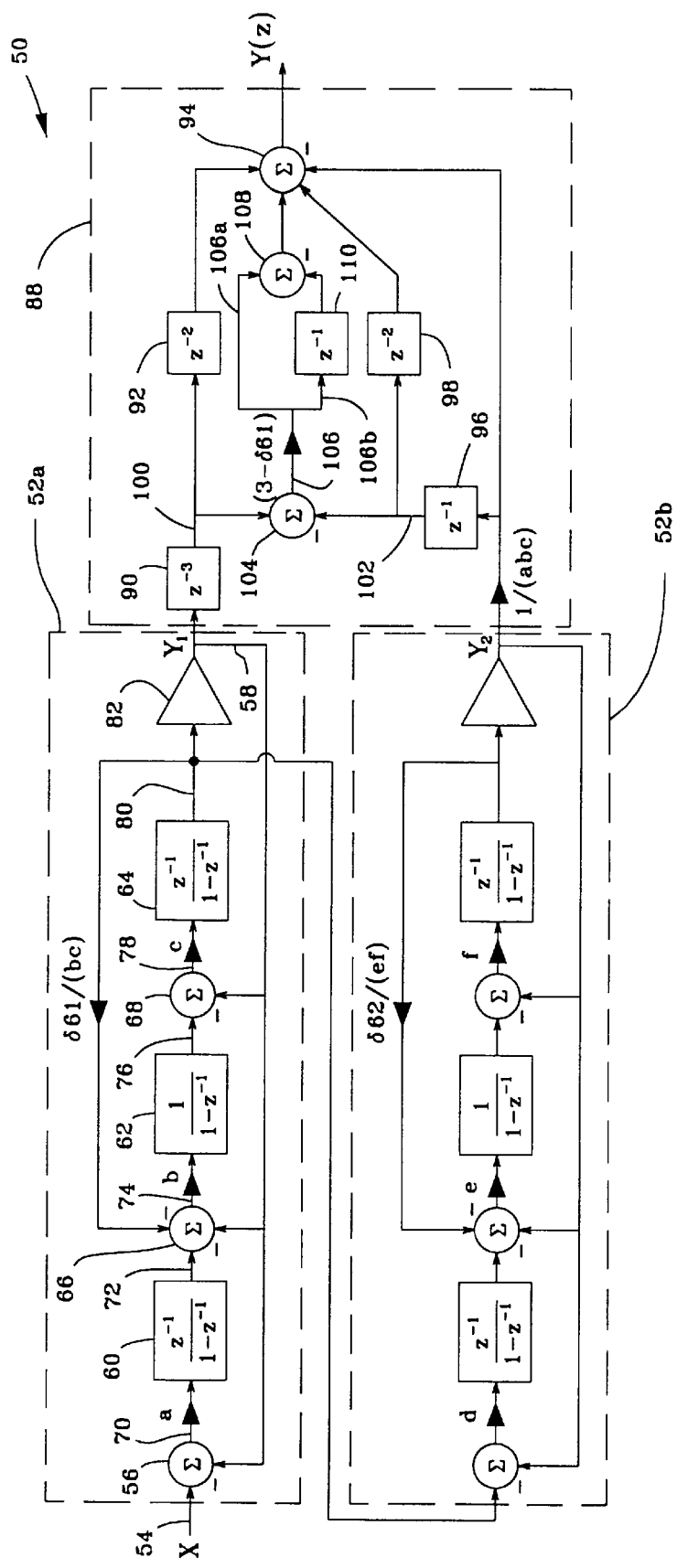
FIG. 2 is a block diagram of a preferred embodiment of a sigma-delta modulator of the present invention having a double third-order cascade.

Referring now to FIG. 2, there is shown a block diagram of a preferred embodiment of a sigma-delta modulator 50 of the present invention having a double third-order cascade architecture. FIG. 2, as well as FIG. 3 to be described later, is based on the inventors' papers "A Sigma-Delta Modulator Architecture For Wide Bandwidth Applications", *Proc. AISCAS-96*, May 14 1996 and "A Two-Stage Sixth-Order Sigma-Delta ADC With 16-bit Resolution Designed For An Oversampling Ratio Of 16", *Proc. MWSCAS-96*, August 1996 which are incorporated into this disclosure in their entirety by reference. Dotted lines 52a and 52b generally denote the third order modulators which make up modulator 50. Like components in modulators 52a and 52b are described using identical numbering for identical components such that the following description applies to both modulators 52a and modulator 52b. Third order modulator 52a has characteristics similar to modulator 10 of FIG. 1, in that input 54 is provided to summing junction 56 with feedback signal 58 being applied to the negative input of summing junction 56. However, filter circuit 14 of FIG. 1 has been split into three single-order integrators 60, 62 and 64, integrators 60 and 64 being delaying integrators of the form $$\frac{z^{-1}}{1-z^{-1}}$$

and integrator 62 being a non-delaying integrator of the form $$\frac{1}{1-z^{-1}}.$$

The integrators are joined by second and third summing junctions 66 and 68. Output 70 of summing junction 56 is provided to integrator 60 which in turn provides output 72 to summing junction 66. Output 74 of summing junction 66 is provided to integrator 62 which in turn provides output 76 to summing junction 68 with output 78 of summing junction 68 being provided to integrator 64. As with the modulator of FIG. 1, the output 80 of integrator 64 is provided to ternary quantizer 82 with the output of quantizer 82, designated as $Y_1$ for modulator 52a and $Y_2$ for modulator 52b, being fed back and applied to the negative inputs of summing junctions 56, 66 and 68. The aspects of modulators 52a and 52b just described are common to third-order modulators well known in the art. Such prior art third-order modulators are not normally designed in a cascade structure due to their marginal stability. In order to achieve a noise shaping characteristic with greater quantization noise suppression, modulators 52a and 52b of the present invention have additional finite zeros placed in the noise transfer function (NTF). The implementation of the two zeros requires little analog circuitry and is accomplished in the third-order modulators 52a and 52b of the present invention by an additional feed back loop. Output 80 is fed back and applied, with the scaling factor $\delta 61/(bc)$ for modulator 52a and scaling factor $\delta 62/(ef)$ for modulator 52b, to the negative input of summing junction 66. This excess dynamic range gained by these additional zeros is very substantial, making this technique particularly useful in wide-band applications where the OSR is inherently low, meaning that the noise shaping filter stop band occupies more relative frequency from DC to $\pi$, i.e., half the sampling rate. In the preferred embodiment of the present invention, modulators 52a and 52b are cascaded, in that output 80 of integrator 64 in modulator 52a is also used as input to third-order modulator 52b, i.e., to summing junction 56 of modulator 52b. The digital noise cancellation (DNC) scheme of the present invention, denoted by dotted line 88, becomes more complex and requires two multiplier blocks, one to properly scale the first-stage quantization noise, i.e., the composite factor (abc) and one to implement the modified triple differentiation, i.e., the factor $(3-\delta_{61})$, to correctly accommodate the NTF zero of the first stage. The final digital output, Y(z), of DNC 88 is computed as follows:

$$Y(z) = Y_1 z^{-2} + (1-z^{-1})(1-z^{-1}[1-\delta_{61}] + z^{-2})\left(\frac{1}{abc}Y_2 - Y_1 z^{-2}\right). \quad (1)$$

It is noted that the analog filter coefficients of integrators 60, 62 and 64, denoted by a, b and c, respectively, can be selected such that the digital scaling factor (1/abc) can be implemented by a simple shift operation, e.g., if the coefficients are chosen equal to 0.3, 0.5 and 0.8333, respectively, this multiplicand turns out to be 8, or $2^3$.

A quantitative expression for the excess noise suppression achieved by the finite zeros can be derived considering the (ideal) numerator polynomial of the NTF of modulator 50 and can be written as follows:

$$N_{3+3}(z)=(1-z^{-1})(1-z^{-1}[2-\delta_{61}]+z^{-2})(1-z^{-1}[2-\delta_{62}]+z^{-2}). \quad (2)$$

Optimum values for the two finite zero loop gains, $\delta_{61}$ and $\delta_{62}$, are chosen to minimize the 2-norm of $|N_{3+3}(z)|$, which is equivalent to minimizing the noise power, i.e., the quantization error in the desired band. The optimal values for $\delta_{61}$ and $\delta_{62}$ are thus:

$$\delta_{61opt} = 0.8633 \frac{\pi^2}{OSR^2} \quad (3)$$

and $$\delta_{62opt} = 0.4100 \frac{\pi^2}{OSR^2}. \quad (4)$$

Inserting an OSR of 16 yields $\delta_{61opt}$=0.01581 and $\delta_{opt}$=0.03328. It is noted that both values are very nearly equal to negative powers of two. Thus the second digital scaling factor, i.e., the difference $(3-\delta_{61})$, can be realized by a simple shift and add operation. Since the sensitivity of the signal to noise ratio with respect to the two zero locations is inherently low, such an approximation would have little effect on the dynamic range. The implementation of DNC 88 as described above is shown in FIG. 2 with output $Y_1$ passing through first function 90, second function 92 and into summing junction 94. Scaling factor (1/abc) is applied to output $Y_2$ which is then passed through third function 96, fourth function 98 and is applied to the negative input of summing junction 94. In addition, output 100 of first function 90 and output 102 of third function 96 are applied to the positive and negative inputs of summing junction 104, respectively. Scaling factor $(3-\delta_{61})$ is applied to output 106 of summing junction 104, which is then split such that output 106a is input to summing junction 108 while output 106b first passes through function 110 before being applied to the negative input of summing junction 108. Output 112 of summing junction 108 is then applied to summing junction 94, the output of summing junction 94 being the value of Y(z).

The rms quantization error of the ternary quantizers are denoted by $e_{rms}$. The influence of the loop filter poles can still be approximately a gain factor despite the lower OSR such that the resulting in-band quantization noise power of modulator 50 can be approximated by the following:

$$n_{3+3}^2 \approx e_{rms}^2 6.5 \times 10^{-3} \frac{\pi^{12}}{13} OSR^{13}. \quad (5)$$

The additional zeros thus improve the noise shaping performance, independent of the OSR, by a factor approximately 153 or 22 dB, respectively. This corresponds to almost four extra bits of resolution, well justifying the additional circuitry required in DNC 88.

By employing only two cascaded stages and by limiting the order of the loop filters to three, amplifier gain and C-ratio matching requirements are kept reasonably low. In contrast to single-loop circuits, cascaded modulators suffer significantly from integrator leakage. Capacitor ratio mismatch errors, on the other hand, result in an incomplete cancellation of the quantization noise of the first stage. Denoting the order of the second modulator loop by n, the amplifier gain demands of such a two-stage cascade are shown to increase as $$\left(\frac{OSR}{\pi}\right)^{n+1},$$

while the C-ratio matching conditions scale as $$\left(\frac{OSR}{\pi}\right)^{-n}.$$

Figure 3:
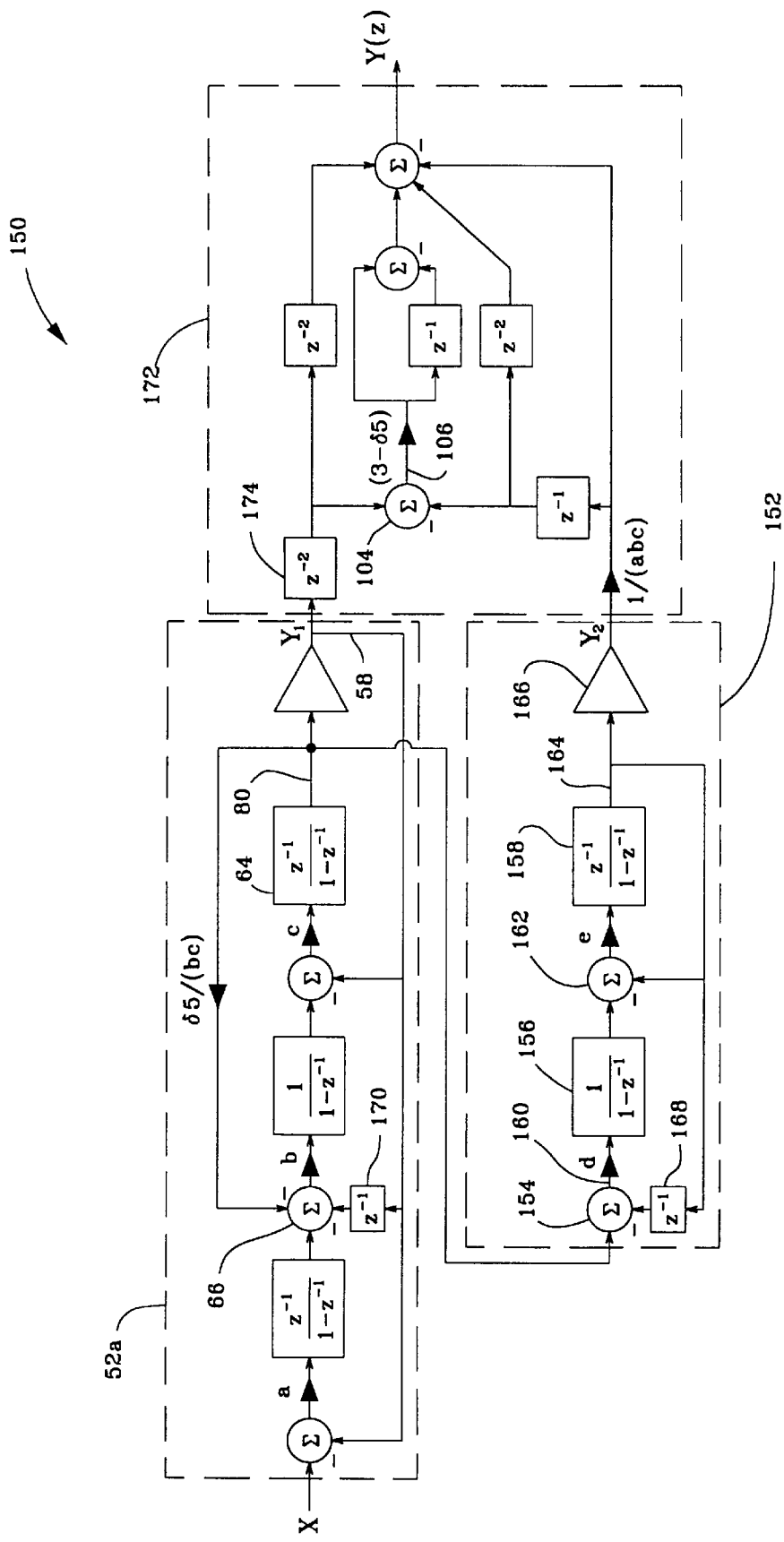
FIG. 3 is a block diagram of another embodiment of a sigma-delta modulator of the present invention having a third-order second-order cascade.

Referring now to the embodiment of modulator 150 of FIG. 3, one can replace modulator 52b of FIG. 2 by a simpler second-order stage 152 in order to relax the amplifier gain and C-ratio matching requirements. However, reduction in the order of the second stage will lower effective resolution since both a noise transfer function zero and an integrator are traded off. As with modulator 52b of FIG. 2, the input to summing junction 154 of second-order stage 152, is output 80 of integrator 64. Second-order stage 152 has integrators 156 and 158. Integrator 156 is a non-delaying integrator and integrator 158 is a delaying integrator. Output 160 of summing junction 154 is provided to integrator 156 which in turn provides its output to summing junction 162 with the output of summing junction 162 being provided to integrator 158. Output 164 of integrator 158 is provided to quantizer 166 with the output of quantizer 166 being the value $Y_2$. Similar to output 58 of quantizer 16 of FIG. 2, output 164 of integrator 158 is fed back to summing junctions 154 and 162. To accommodate the second-order configuration, output 164 is passed through function 168 prior to being applied to the negative input of summing junction 154. Similarly, output 58 is passed through function 170 prior to being applied to the negative input of summing junction 66 in modulator 52a. With the use of second-order modulator 152 only the NTF zero loop of output 80 of integrator 64 to summing junction 66 is required. For the third-order, second-order modulator of FIG. 3, the output Y(z) is computed as follows:

$$Y(z) = Y_1 z^{-2} + (1-z^{-1})(1-z^{-1}[2-\delta_{61}]+z^{-2})\left(\frac{1}{abc}Y_2 - Y_1 z^{-2}\right). \quad (6)$$

The DNC scheme for the embodiment of FIG. 3, denoted by dotted line 172, therefor has a slightly different configuration than that of DNC 88 of FIG. 2 in that function 90 is replaced with function 174 and a scaling factor of $(3-\delta_5)$ is applied to output 106 of summing junction 104.

The numerator polynomial for modulator 150 can be written as follows:

$$N_{3+3}(z)=(1-z^{-1})^3(1-z^{-1}[2-\delta_5]+z^{-2}). \quad (7)$$

The optimum value of the loop gain of the first stage turns out to be:

$$\delta_{5opt} = \frac{7}{9}\frac{\pi^2}{OSR^2}. \quad (8)$$

Inserting this value into the noise power transfer function yields the following approximate expression for the total output noise power:

$$n_{3+3}^2 \approx e_{rms}^2 \frac{4}{81} \frac{\pi^2}{11} OSR^{-11}. \qquad (9)$$

The additional quantization noise suppression factor introduced by this single zero is thus approximately equal to 20 or 13 dB, respectively. This still corresponds to more than two extra bits of resolution. The additional multiplication factor $(3-\delta_5)$ is a comparatively small price to be paid for the substantially improved dynamic range.

What has thus been described is a wide-band sigma-delta modulator having a double third-order cascaded architecture. Both third-order stages utilize simple ternary quantizers to avoid linearity problems associated with the DAC's in the feedback paths of the modulators. Additional finite NTF zeros are added to the third-order stages by means of an additional feed back loop between the output of the third integrator and the second summing junction. The NTF zeros serve to maximize the dynamic range. The excess dynamic range gained by these additional zeros is substantial and independent of OSR, hence, the present invention is particularly useful in wide-band applications where the OSR is inherently low. The new topology significantly enhances the dynamic range of the system while hardly affecting the circuit's sensitivity with regard to some non-idealities such as finite amplifier open-loop gains or capacitor ratio mismatches. By employing only two cascaded stages and by limiting the order of the loop filters to three, amplifier gain and capacitor ratio matching requirements are kept reasonably low. In addition, a second embodiment having a third-order, second-order cascaded architecture is provided which further relaxes the amplifier gain and C-ratio matching requirements.

Thus, it will be understood that additional changes in the details and arrangement of parts, or in the values for various coefficients which have been herein described and illustrated in order to explain the nature of the invention, may be made by those skilled in the art within the principle and scope of the invention as expressed in the appended claims. For example, by implementing the sigma-delta modulator of the present invention on a computer, the modulator can be utilized in a digital to analog converter. Further, the modulator can be implemented as discrete-time analog either by means of a switched-capacitor filter/integrator or by means of a switched-current integrator. It may also be implemented by means of an analog integrator where phase is used to delay energy. Further, the architecture described is applicable to any cascade of a third-order or higher first stage and a second-order or higher second stage, e.g., a fourth-order, fourth-order cascade, or a fifth-order, third-order cascade.

In light of the above, it is therefore understood that within the scope of the appended claims, the invention may be practiced otherwise than as specifically described.

What is claimed is:

1. A device for implementing a conversion of an input signal from at least one of an analog input signal to a digital output signal and a digital input signal to an analog output signal, the device comprising:
    a first high-order sigma-delta modulator receiving the input signal and providing a first modulated signal and a second modulated signal $Y_1$, the first high-order sigma-delta modulator being at least a third-order sigma-delta modulator;
    a second high-order sigma-delta modulator in cascaded communication with the first high-order sigma-delta modulator, the second high-order sigma-delta modulator being at least a second-order sigma-delta modulator, the second third-order modulator receiving the first modulated signal and providing a third modulated signal $Y_2$; and
    a digital noise canceling portion receiving the second and third modulated signals and providing a noise canceled output $Y(z)$ for obtaining the output signal.

2. The device of claim 1 wherein the first high-order sigma-delta modulator further comprises:
    a first integrator portion receiving the input signal and providing the first pre-quantized signal;
    a first converter portion receiving the first pre-quantized signal and providing the first modulated signal $Y_1$; and
    a first feedback loop for processing a difference between the input signal and the first modulated signal and providing a first error signal, the first feedback loop returning the first error signal to the first integrator portion to combine the input signal and the first error signal, the combination of the input signal and the first error signal de-correlating a quantization noise from the input signal, the quantization noise generated when the input signal is converted to the output signal.

3. The device of claim 2 wherein the second high-order sigma-delta modulator further comprises:
    a second integrator portion receiving the first pre-quantized signal and providing a second pre-quantized signal;
    a second converter portion receiving the second pre-quantized signal and providing the second modulated signal $Y_2$; and
    a second feedback loop for processing a difference between the first pre-quantized signal and the second pre-quantized signal and providing a second error signal, the second feedback loop returning the second error signal to the second integrator portion to combine the first pre-quantized signal and the second error signal, the combination of the first pre-quantized signal and the second error signal de-correlating the quantization noise from the first pre-quantized signal.

4. The device of claim 3 wherein the first integrator portion further comprises a first noise transfer function feedback loop receiving the first pre-quantized signal, scaling the first pre-quantized signal by a first factor dependent on characteristics of the first integrator portion and applying the scaled first pre-quantized signal to the first integrator portion to introduce a first noise transfer function zero into the first high-order modulator, the first noise transfer function zero placing a first null in a frequency spectrum of the quantization noise.

5. The device of claim 4 wherein the second integrator portion further comprises a second noise transfer function feedback loop receiving the second pre-quantized signal, scaling the second pre-quantized signal by a second factor dependent on characteristics of the second integrator portion and applying the scaled second pre-quantized signal to the second integrator portion to introduce a second noise transfer function zero into the second high-order modulator, the second noise transfer function zero placing a second null in the frequency spectrum of the quantization noise.

6. The device of claim 5 wherein the first integrator portion further comprises:
    a first summing junction receiving the input signal at a positive input thereof, receiving the first error signal at a negative input thereof, summing the input signal and the first error signal and providing a first summed output;

a first delaying integrator receiving the first summed output and operating on the first summed output to provide a first integrated output;

a second summing junction receiving the first integrated output at a positive input thereof, receiving the first error signal at a negative input thereof, receiving the scaled first pre-quantized signal at a negative input thereof, summing the first integrated output, the first error signal and the scaled first pre-quantized signal and providing a second summed output;

a first non-delaying integrator receiving the second summed output and operating on the second summed output to provide a second integrated output;

a third summing junction receiving the second integrated output at a positive input thereof, receiving the first error signal at a negative input thereof, summing the second integrated output and the first error signal and providing a third summed output; and a second delaying integrator receiving the third summed output and operating on the third summed output to provide the first pre-quantized signal.

7. The device of claim 6 wherein the second integrator portion further comprises:

a fourth summing junction receiving the first pre-quantized signal at a positive input thereof, receiving the second error signal at a negative input thereof, summing the first pre-quantized signal and the second error signal and providing a fourth summed output;

a third delaying integrator receiving the fourth summed output and operating on the fourth summed output to provide a fourth integrated output;

a fifth summing junction receiving the fourth integrated output at a positive input thereof, receiving the second error signal at a negative input thereof, receiving the scaled second pre-quantized signal at a negative input thereof, summing the fourth integrated output, the second error signal and the scaled second pre-quantized signal and providing a fifth summed output;

a second non-delaying integrator receiving the fifth summed output and operating on the fifth summed output to provide a fifth integrated output;

a sixth summing junction receiving the fifth integrated output at a positive input thereof, receiving the second error signal at a negative input thereof, summing the fifth integrated output and the second error signal and providing a sixth summed output; and a fourth delaying integrator receiving the sixth summed output and operating on the sixth summed output to provide the second pre-quantized signal.

8. The device of claim 7 wherein the digital noise cancellation portion operates on the first and second modulated signals to provide the noise canceled output Y(z) in accordance with the relationship $$Y(z) = Y_1 z^{-2} + (1 - z^{-1})(1 - z^{-1}[2 - \delta_{61}] + z^{-2})\left(\frac{1}{abc} Y_2 - Y_1 z^{-2}\right),$$

where z is a transfer function and $\delta_{61}$, a, b and c are characteristics of the first high-order modulator.

9. The device of claim 7 wherein:

the first factor is equivalent to $\delta_{61}/(bc)$, where $\delta_{61}$ is a characteristic of the first integrator portion, b is a characteristic of the first non-delaying integrator and c is a characteristic of the second delaying integrator; and the second factor is equivalent to $\delta_{62}/(ef)$, where $\delta_{62}$ is a characteristic of the second integrator portion, e is a characteristic of the second non-delaying integrator and f is a characteristic of the fourth delaying integrator.

10. The device of claim 4 wherein the first integrator portion further comprises:

a first summing junction receiving the input signal at a positive input thereof, receiving the first error signal at a negative input thereof, summing the input signal and the first error signal and providing a first summed output;

a first delaying integrator receiving the first summed output and operating on the first summed output to provide a first integrated output;

a first transfer function of the form $z^{-1}$ operating on the first error signal to provide a first transfer signal;

a second summing junction receiving the first integrated output at a positive input thereof, receiving the first transfer signal at a negative input thereof, receiving the scaled first pre-quantized signal at a negative input thereof, summing the first integrated output, the first transfer signal and the scaled first pre-quantized signal and providing a second summed output;

a first non-delaying integrator receiving the second summed output and operating on the second summed output to provide a second integrated output;

a third summing junction receiving the second integrated output at a positive input thereof, receiving the first error signal at a negative input thereof, summing the second integrated output and the first error signal and providing a third summed output; and a second delaying integrator receiving the third summed output and operating on the third summed output to provide the first pre-quantized signal.

11. The device of claim 10 wherein the second integrator portion further comprises:

a second transfer function of the form $z^{-1}$ operating on the second error signal to provide a second transfer signal;

a fourth summing junction receiving the first pre-quantized signal at a positive input thereof, receiving the second transfer signal at a negative input thereof, summing the first pre-quantized signal and the second error signal and providing a fourth summed output;

a second non-delaying integrator receiving the fourth summed output and operating on the fourth summed output to provide a fourth integrated output;

a fifth summing junction receiving the fourth integrated output at a positive input thereof, receiving the second error signal at a negative input thereof, summing the fourth integrated output and the second error signal and providing a fifth summed output; and a third delaying integrator receiving the fifth summed output and operating on the fifth summed output to provide the second pre-quantized signal.

12. The device of claim 11 wherein the digital noise cancellation portion operates on the first and second modulated signals to provide the noise canceled output Y(z) in accordance with the relationship $$Y(z) = Y_1 z^{-1} + (1 - z^{-1})(1 - z^{-1}[2 - \delta_5] + z^{-2})\left(\frac{1}{abc} Y_2 - Y_1 z^{-1}\right),$$

where z is a transfer function and $\delta_5$, a, b and c are characteristics of the first high-order modulator.

13. The device of claim 10 wherein the first factor is equivalent to $\delta_5/(bc)$, where $\delta_5$ is a characteristic of the first integrator portion, b is a characteristic of the first non-delaying integrator and c is a characteristic of the second delaying integrator.

14. The device of claim 1 wherein the digital noise cancellation portion further comprises:

a first transfer function of the form $z^{-3}$ for operating on the first modulated signal $Y_1$ from the first high-order modulator, the first high-order modulator being of the third-order, the first transfer function providing a first transfer signal;

a second transfer function of the form $z^{-2}$ for operating on the first transfer signal and providing a second transfer signal;

a third transfer function of the form $z^{-1}$ scaling the second modulated signal $Y_2$ from the second high-order modulator by a first factor dependent on characteristics of the modulators, the second high-order modulator being of the third-order, the third transfer function operating on the scaled second modulated signal and providing a third transfer signal;

a fourth transfer function of the form $z^{-2}$ for operating on the third transfer signal and providing a fourth transfer signal;

a first summing junction receiving the first transfer signal at a positive input thereof, receiving the third transfer signal at a negative input thereof, summing the first and third transfer signals, providing a first summed output and scaling the summed output by a second factor dependent on characteristics of the modulators;

a fifth transfer function of the form $z^{-1}$ operating on the scaled first summed output and providing a fifth transfer signal;

a second summing junction receiving the scaled first summed output at a positive input thereof, receiving the fifth transfer signal at a negative input thereof, summing the scaled first summed output and the fifth transfer signal and providing a second summed output; and a third summing junction receiving the second transfer signal at a positive input thereof, receiving the fourth transfer signal at a negative input thereof, receiving the scaled second modulated signal at a negative input thereof, receiving the second summed output at a negative terminal thereof, summing the second transfer signal, the fourth transfer signal, the scaled second modulated signal and the second summed output and providing the noise canceled output Y(z).

15. The device of claim 1 wherein the digital noise cancellation portion further comprises:

a first transfer function of the form $z^{-2}$ for operating on the first modulated signal $Y_1$ from the first high-order modulator, the first high-order modulator being of the third-order, the first transfer function providing a first transfer signal;

a second transfer function of the form $z^{-2}$ for operating on the first transfer signal and providing a second transfer signal;

a third transfer function of the form $z^{-1}$ scaling the second modulated signal $Y_2$ from the second high-order modulator by a first factor dependent on characteristics of the modulators, the second high-order modulator being of the second-order, the third transfer function operating on the scaled second modulated signal and providing a third transfer signal;

a fourth transfer function of the form $z^{-2}$ for operating on the third transfer signal and providing a fourth transfer signal;

a first summing junction receiving the first transfer signal at a positive input thereof, receiving the third transfer signal at a negative input thereof, summing the first and third transfer signals, providing a first summed output and scaling the summed output by a second factor dependent on characteristics of the modulators;

a fifth transfer function of the form $z^{-1}$ operating on the scaled first summed output and providing a fifth transfer signal;

a second summing junction receiving the scaled first summed output at a positive input thereof, receiving the fifth transfer signal at a negative input thereof, summing the scaled first summed output and the fifth transfer signal and providing a second summed output; and a third summing junction receiving the second transfer signal at a positive input thereof, receiving the fourth transfer signal at a negative input thereof, receiving the scaled second modulated signal at a negative input thereof, receiving the second summed output at a negative terminal thereof, summing the second transfer signal, the fourth transfer signal, the scaled second modulated signal and the second summed output and providing the noise canceled output Y(z).

16. The device of claim 1 wherein:

the conversion is from the digital input signal to the analog output signal; and the device is implemented on a computer.

17. The device of claim 1 wherein:

the conversion is from the analog input signal to the digital output signal; and the device is a discrete-time analog device.

18. The device of claim 17 wherein the modulators are switched-capacitor filter and integrator modulators.

19. The device of claim 17 wherein the modulators are switched-current integrator modulators.

20. The device of claim 1 wherein:

the conversion is from the analog input signal to the digital output signal; and the device utilizes phase for energy delay.

* * * * *